US007326658B2

United States Patent
Iida et al.

(10) Patent No.: US 7,326,658 B2
(45) Date of Patent: Feb. 5, 2008

(54) METHOD FOR PREPARING NITROGEN-DOPED ANNEALED WAFER AND NITROGEN-DOPED AND ANNEALED WAFER

(75) Inventors: Makoto Iida, Gunma (JP); Masaro Tamatsuka, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 245 days.

(21) Appl. No.: 10/333,771

(22) PCT Filed: May 22, 2002

(86) PCT No.: PCT/JP02/04940

§ 371 (c)(1),
(2), (4) Date: Jan. 22, 2003

(87) PCT Pub. No.: WO02/097875

PCT Pub. Date: Dec. 5, 2002

(65) Prior Publication Data

US 2003/0157814 A1    Aug. 21, 2003

(30) Foreign Application Priority Data

May 28, 2001    (JP)    ............... 2001-158516

(51) Int. Cl.
  *H01L 21/324* (2006.01)
  *H01L 21/477* (2006.01)
  *H01L 21/42* (2006.01)
  *H01L 21/26* (2006.01)
(52) U.S. Cl. .................. 438/795; 438/799; 117/13; 117/20; 257/E21.321; 257/E21.324
(58) Field of Classification Search .......... 438/795, 438/799; 117/13, 20
See application file for complete search history.

(56) References Cited

U.S. PATENT DOCUMENTS

2004/0192071 A1* 9/2004 Kobayashi et al. ......... 438/795

FOREIGN PATENT DOCUMENTS

| EP | 0 954 018 | 11/1999 |
| EP | 1 170 404 | 1/2002 |
| JP | 58-087833 | 5/1983 |
| JP | 10-223641 | 8/1998 |
| JP | 11-189493 | 7/1999 |
| JP | 2001-064095 | 3/2001 |
| JP | 2001-139396 | 5/2001 |

OTHER PUBLICATIONS

Katsuhiko Nakai et al., "Oxygen Precipitation in Nitrogen-Doped Czochralski-grown silicon crystals", Journal of Applied Physics, vol. 89, No. 8, Apr. 15, 2001, pp. 4301-4309.*

(Continued)

Primary Examiner—Scott B. Geyer
Assistant Examiner—Mohsen Ahmadi
(74) Attorney, Agent, or Firm—Hogan & Hartson LLP

(57) ABSTRACT

The present invention provides a method for producing a nitrogen-doped annealed wafer, wherein before a wafer sliced from a silicon single crystal doped with at least nitrogen and polished is subjected to a high temperature heat treatment at 1100° C. to 1350° C. in an atmosphere of argon, hydrogen or a mixed gas thereof, a step of maintaining the wafer at a temperature lower than the treatment temperature of the high temperature heat treatment is conducted to allow growth of oxygen precipitation nuclei having such a size that the nuclei should be annihilated by the high temperature heat treatment to such a size that the nuclei should not be annihilated by the high temperature heat treatment, and then the high temperature heat treatment is performed. Thus, there are provided a nitrogen-doped annealed wafer with reducing variation of the BMD density after the annealing among silicon single crystal wafers sliced from various positions of the silicon single crystal without being affected by concentration of nitrogen doped in a silicon single crystal and a method for producing the same.

4 Claims, 4 Drawing Sheets

OTHER PUBLICATIONS

Katsuhiko Nakai et al., "Oxygen Precipitation in Nitrogen-Doped Czochralski-Grown Silicon Crystals", Journal of Applied Physics, vol. 89, No. 8, Apr. 15, 2001, pp. 4301-4309.

F. Shimura et al., "Nitrogen Effects on Oxygen Precipitation in Czochralski Silicon", Appl. Phys. Lett. 48 (3), Jan. 20, 1986, pp. 224-226.

* cited by examiner

METHOD FOR PREPARING NITROGEN-DOPED ANNEALED WAFER AND NITROGEN-DOPED AND ANNEALED WAFER

TECHNICAL FIELD

The present invention relates to a method for producing a nitrogen-doped annealed wafer by using a silicon single crystal doped with nitrogen.

BACKGROUND ART

In recent years, use of higher integration degree and finer processes as well as lower process temperature in the device processes are accelerated. Therefore, in regard to a silicon wafer, there are required integrity of device-active region of the surface layer and an improvement of gettering ability for capturing impurities of metals and so forth formed due to increase of bulk micro defects (BMD) consisting of oxide precipitates (nuclei) in the bulk, and so forth.

As for these requirements, various approaches have been attempted. For example, nitrogen doping is performed during the growth of a silicon single crystal by the Czochralski method (CZ method), thereby a silicon single crystal ingot in which growth of grown-in defects is suppressed and oxygen precipitation is promoted can be produced. Then, a mirror surface wafer sliced from such a nitrogen-doped silicon single crystal and polished is subjected to a high temperature annealing in which the wafer is subjected to a heat treatment at a high temperature (1100° C. to 1350° C.) for a long period of time using argon gas, hydrogen gas or the like, and thereby a wafer (annealed wafer) simultaneously realizing integrity of the surface layer and increase of density of oxygen precipitation nuclei in the bulk can be produced.

When a silicon single crystal doped with nitrogen is grown by the CZ method, nitrogen is taken in the crystal from silicon melt while it undergoes segregation. At this time, since the segregation coefficient of nitrogen is extremely small, i.e., 0.0007, nitrogen concentration in the single crystal ingot becomes low near the shoulder and becomes high near the tail. The ratio between the nitrogen concentrations is around 3 to 7 times. Therefore, the sizes of oxygen precipitation nuclei existing in the crystal also vary depending on the positions for slicing. Thus, a wafer sliced from the ingot at a position near the shoulder, which has a low nitrogen concentration, shows small size of oxygen precipitation nuclei, and a wafer sliced from the ingot at a position near the tail, which has a high nitrogen concentration, contains oxygen precipitation nuclei having a relatively large size.

Further, when such a high temperature heat treatment as the aforementioned argon annealing is applied to a mirror surface wafer, although oxygen precipitation nuclei having a relatively large size remain even after the heat treatment, oxygen precipitation nuclei having a small size are melted. Therefore, if BMD densities of annealed wafers sliced from one nitrogen-doped silicon single crystal at various positions are compared, variation of the density was observed depending on the positions at which the single crystal ingot was sliced.

Such variation of BMD density among nitrogen-doped annealed wafers as described above also results in variation of the gettering ability of the wafers, and this constitutes one of the causes of reduction of yield and productivity of devices as a result.

DISCLOSURE OF THE INVENTION

The present invention was accomplished in view of the aforementioned problems, and an object of the present invention is to provide a nitrogen-doped annealed wafer with reducing variation of the BMD density after the annealing among silicon single crystal wafers sliced from various positions of the silicon single crystal without being affected by concentration of nitrogen doped in a silicon single crystal and a method for producing the same.

In order to achieve the aforementioned object, the present invention provides a method for producing a nitrogen-doped annealed wafer, wherein before a wafer sliced from a silicon single crystal doped with at least nitrogen and polished is subjected to a high temperature heat treatment at 1100° C. to 1350° C. in an atmosphere of argon, hydrogen or a mixed gas thereof, a step of maintaining the wafer at a temperature lower than the treatment temperature of the high temperature heat treatment is conducted to allow growth of oxygen precipitation nuclei to such a size that the nuclei should not be annihilated by the high temperature heat treatment, and then the high temperature heat treatment is performed.

By conducting the step of maintaining a nitrogen-doped silicon single crystal wafer at a temperature lower than the treatment temperature of the high temperature heat treatment before the wafer is subjected to the high temperature heat treatment as described above, oxygen precipitation nuclei can be grown to such a size that the nuclei should not be annihilated by the high temperature heat treatment. And then, by subjecting the wafer to the high temperature heat treatment, it is possible to produce a nitrogen-doped annealed wafer having a uniform BMD density irrespective of the position of the single crystal ingot at which the wafer is sliced.

The temperature region for the high temperature heat treatment is defined from 1100° C. to 1350° C., because defects near the wafer surface cannot be fully eliminated at a temperature lower than 1100° C., and problems concerning contamination with metals and durability of furnace are caused due to the heat treatment at a temperature exceeding 1350° C.

The size of nuclei that are annihilated by the high temperature heat treatment and the size of nuclei that are not annihilated by the high temperature heat treatment are determined depending on the conditions of the high temperature heat treatment (temperature and time).

In the aforementioned method, the step of maintaining the wafer at a temperature lower than the treatment temperature of the high temperature heat treatment is preferably conducted during a process of increasing temperature to the treatment temperature of the high temperature heat treatment.

If the step of maintaining the wafer at a temperature lower than the treatment temperature of the high temperature heat treatment is conducted during a process of increasing temperature to the treatment temperature of the high temperature heat treatment as described above, heat treatment time for the whole process can be shortened, and thus the oxygen precipitation nuclei can be efficiently grown.

Further, in the aforementioned method, the step of maintaining the wafer at a temperature lower than the treatment temperature of the high temperature heat treatment is preferably a step of maintaining the wafer within a temperature region of from 700° C. to 900° C. for 60 minutes or more.

If the wafer is maintained at the temperature region of from 700° C. to 900° C. for 60 minutes or more before the wafer is subjected to the high temperature heat treatment, oxygen precipitation nuclei can be surely grown to such a size that the nuclei should not be annihilated by the high temperature heat treatment. As a result, variation of the BMD densities after the annealing among wafers sliced from a single crystal ingot at various positions can be reduced.

In this case, the step of maintaining the wafer within the temperature region of from 700° C. to 900° C. for 60 minutes or more is preferably performed with a rate of increasing temperature of 3° C./min or less for the temperature region of from 700° C. to 900° C.

If the step of maintaining the wafer within the temperature region of from 700° C. to 900° C. for 60 minutes or more is performed with a temperature increasing rate of 3° C./min or less as described above, oxygen precipitation nuclei having a small size can be sufficiently and efficiently grown.

Further, according to the aforementioned production method, the present invention can provide a nitrogen-doped annealed wafer of high quality in which variation of the oxygen precipitation characteristics is reduced among various positions of a silicon single crystal.

As explained above, according to the present invention, by conducting a step of maintaining a wafer sliced from a nitrogen-doped silicon single crystal and polished at a temperature lower than the temperature of the high temperature heat treatment before subjecting it to the high temperature heat treatment, oxygen precipitation nuclei can be grown to such a size that the nuclei should not be annihilated by the high temperature heat treatment. Thus, variation of the oxygen precipitation characteristics is reduced among wafers produced from various positions of a silicon single crystal ingot, and a nitrogen-doped annealed wafer having a high BMD density can be obtained even from a wafer having a low nitrogen concentration.

BEST MODE FOR CARRYING OUT THE INVENTION

Hereafter, the present invention will be explained in detail. However, the present invention is not limited to these explanations.

In a high temperature annealing performed by using argon or the like, in general, a wafer is loaded into a heat treatment furnace at a low temperature, and the temperature is gradually increased to a predetermined heat treatment temperature so that slip dislocations should not be introduced into the wafer. At this time, a higher rate of increasing temperature results in a shorter treatment time, and therefore, the throughput can be improved. This results in reduction of the production cost. Accordingly, when the annealing is performed, the rate of increasing temperature to the heat treatment temperature is generally set to be a highest rate that does not introduce slip dislocations into the wafer.

Figure 1:
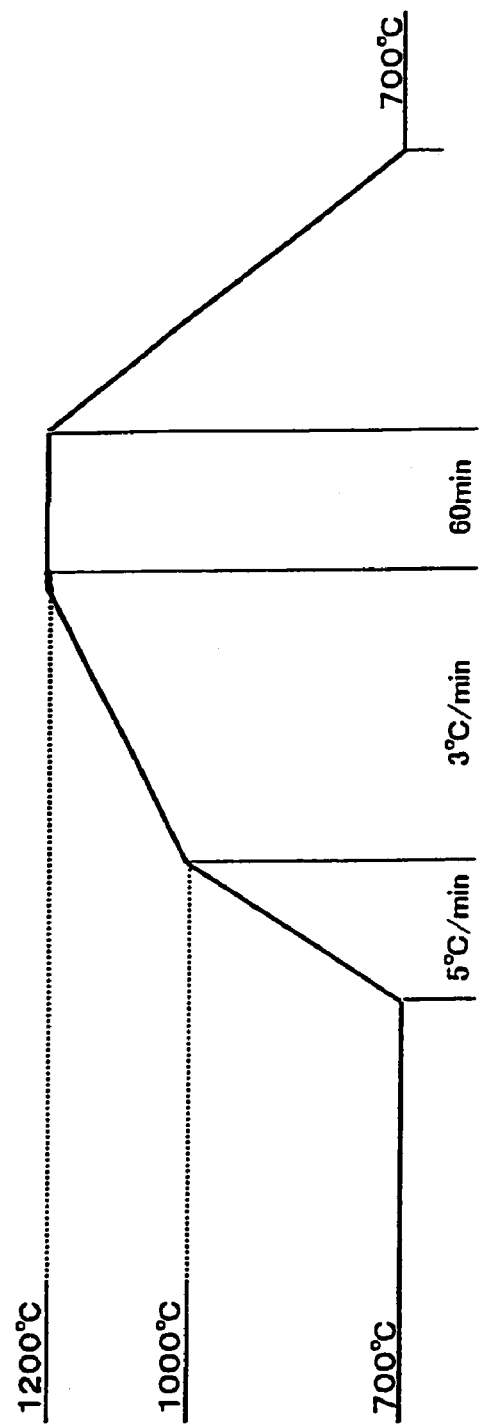
FIG. 1 is a figure showing an annealing recipe in conventional annealing.

The annealing recipe shown in FIG. 1 is an example for such annealing, and the annealing is performed in an argon atmosphere (100% of argon gas) according to a process in which a wafer is loaded at 700° C., and the rate of increasing temperature is set at 5° C./min up to 1000° C. and 3° C./min from 1000° C. to 1200° C.

However, if wafers obtained from a nitrogen-doped silicon single crystal were subjected to a high temperature heat treatment according to the aforementioned conventional annealing recipe, significant variation in BMD density of the obtained annealed wafers was observed in spite of use of mirror surface wafers sliced from the same silicon single crystal ingot. It was found that, in particular, a wafer sliced from a portion of straight body nearer the shoulder of the crystal (namely, lower nitrogen concentration) tended to have a lower BMD density.

As a result of the investigation about the cause of such a phenomenon, it was found that a lower nitrogen concentration of the wafer provided a smaller size of the oxygen precipitation nuclei existing before the heat treatment, and therefore such nuclei were more likely to be melted and annihilated by the high temperature annealing. Therefore, the inventors of the present invention conceived that, if oxygen precipitation nuclei having a small size could be grown to a size that did not allow melting of the nuclei by the high temperature annealing before the temperature of the wafer reached the temperature at which the high temperature annealing was performed, even a wafer sliced from the low nitrogen concentration side of a single crystal ingot (a portion near the shoulder) could have a BMD density at same level as that of a wafer sliced from the high nitrogen concentration side of the same single crystal ingot (a portion near the tail), and conducted various investigations to accomplish the present invention.

That is, by performing a step of maintaining a wafer sliced from a nitrogen-doped silicon single crystal and polished within a low temperature region lower than the treatment temperature of the high temperature heat treatment at 1100° C. to 1350° C. in an atmosphere of argon, hydrogen or a mixed gas thereof for a certain period of time before the wafer is subjected to the high temperature heat treatment, the oxygen precipitation nuclei having such a small size that the nuclei should be annihilated at a temperature of the conventional high temperature heat treatment can be grown to such a size that the nuclei should not annihilated at the temperature of the conventional high temperature heat treatment, and then the high temperature heat treatment can be performed. By growing oxygen precipitation nuclei within a low temperature region as described above, even if the wafer sliced from the low nitrogen concentration side of the ingot (a portion near the shoulder) is subjected to the high temperature heat treatment, the oxygen precipitation nuclei in the wafer are not melted and can be remained. As a result, nitrogen-doped annealed wafers having a uniform BMD density can be obtained irrespective of positions of the ingot at which the wafers have been sliced.

In this case, by performing the step of maintaining the wafer within the low temperature region lower than the high temperature heat treatment temperature during a process of increasing temperature to the treatment temperature of the high temperature heat treatment, heat treatment time of the whole process can be shortened. And thereby, the throughput of the annealing of wafers is increased, reduction of the production cost can be accomplished.

Hereafter, specific embodiments of the present invention will be explained in detail with reference to the drawings.

First, a nitrogen-doped silicon single crystal ingot was grown by the CZ method. The obtained silicon single crystal ingot had a nitrogen concentration ratio of 5 times between a portion near the shoulder and a portion near the tail. This nitrogen-doped silicon single crystal was sliced into wafers, and the wafers are polished to prepare mirror surface wafers corresponding to various positions of the ingot. Before the wafers were subjected to a high temperature heat treatment, they were subjected to a step of maintaining them at a low temperature region lower than the temperature of the high temperature heat treatment. More specifically, they were subjected to annealing in an argon atmosphere according to the annealing recipe (FIG. 2) in which the rate of increasing temperature for a low temperature region of from 700° C. to 900° C. was reduced to 2° C./min from the conventional rate of 5° C./min. Then, those wafers were subjected to a precipitation heat treatment, and BMD densities of the wafers were measured.

Figure 2:
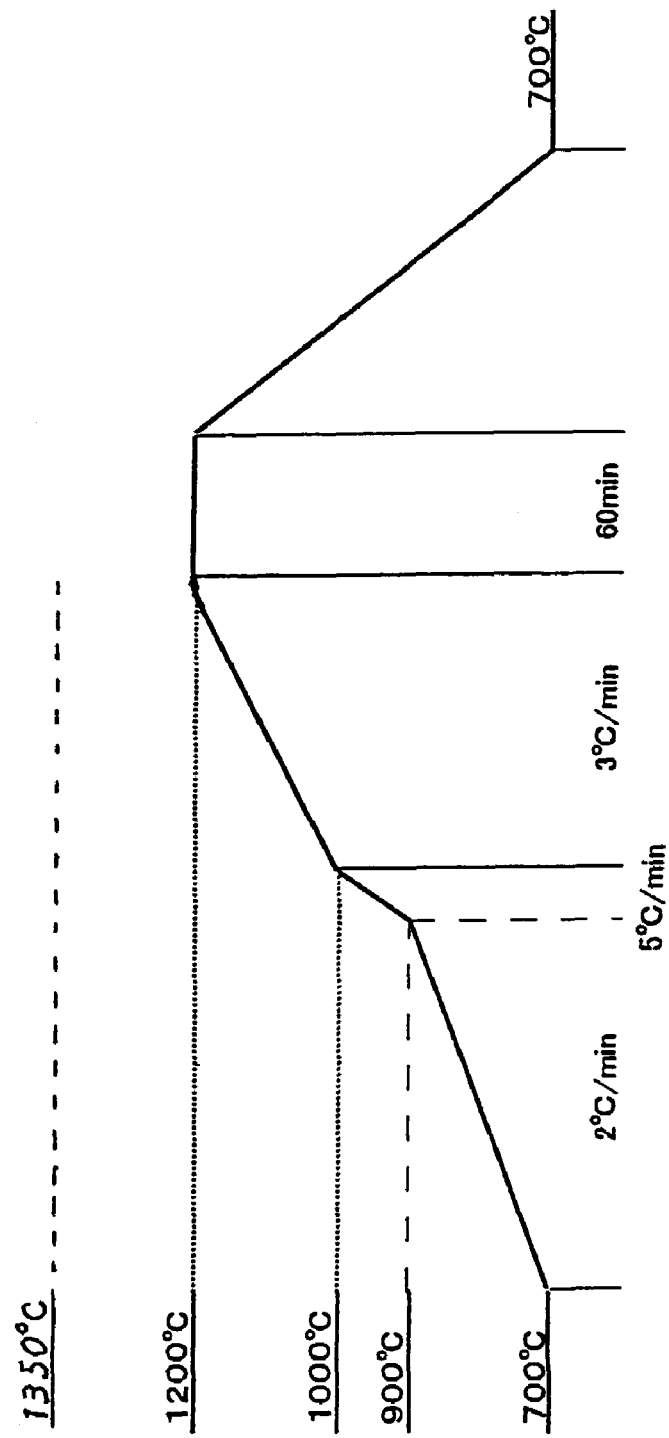
FIG. 2 is a figure showing an annealing recipe in annealing according to the present invention.
Figure 3:
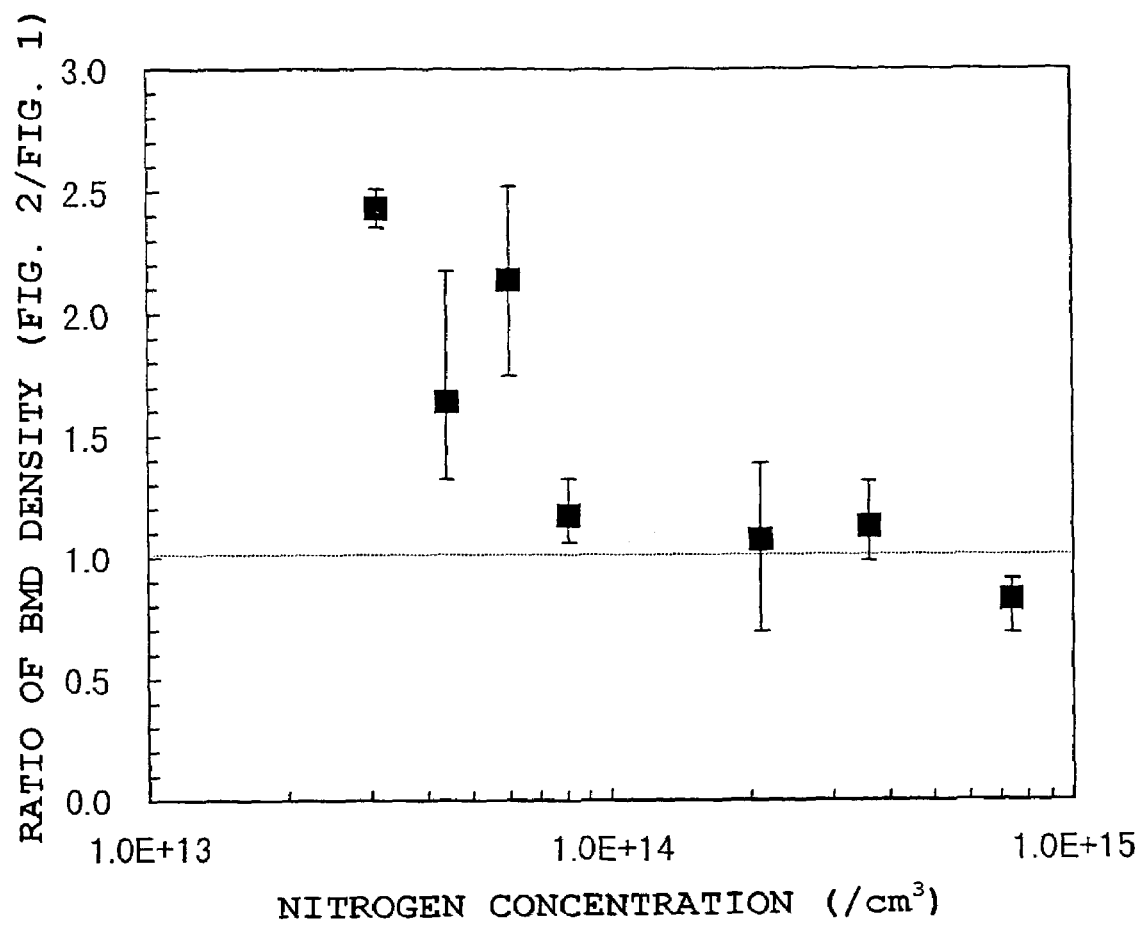
FIG. 3 is a figure showing ratios of BMD densities between wafers subjected to a heat treatment according to the annealing recipe of the present invention and wafers subjected to a heat treatment according to the conventional annealing recipe.

Ratios of the BMD densities of the wafers subjected to the heat treatment according to the annealing recipe of FIG. 2 (annealing recipe of the present invention) to the BMD densities of the wafers subjected to the heat treatment according to the annealing recipe of FIG. 1 (conventional annealing recipe) are shown in FIG. 3 (FIG. 2/FIG. 1)

From the results of the above, it could be confirmed that the annealed wafers subjected to the heat treatment according to the conventional annealing recipe and the annealed wafers produced according to the present invention were significantly different in the BMD density. It could also be confirmed that the wafers having a low nitrogen concentration of less than $1.0 \times 10^{14}/cm^3$, in particular, were greatly influenced by the rate of increasing temperature, but the BMD densities of the wafers having a high nitrogen concentration did not vary so significantly. Even when the heat treatment was performed in an atmosphere of a mixed gas of argon gas and hydrogen gas or 100% hydrogen gas atmosphere, results showing the same tendency were obtained.

Figure 4:
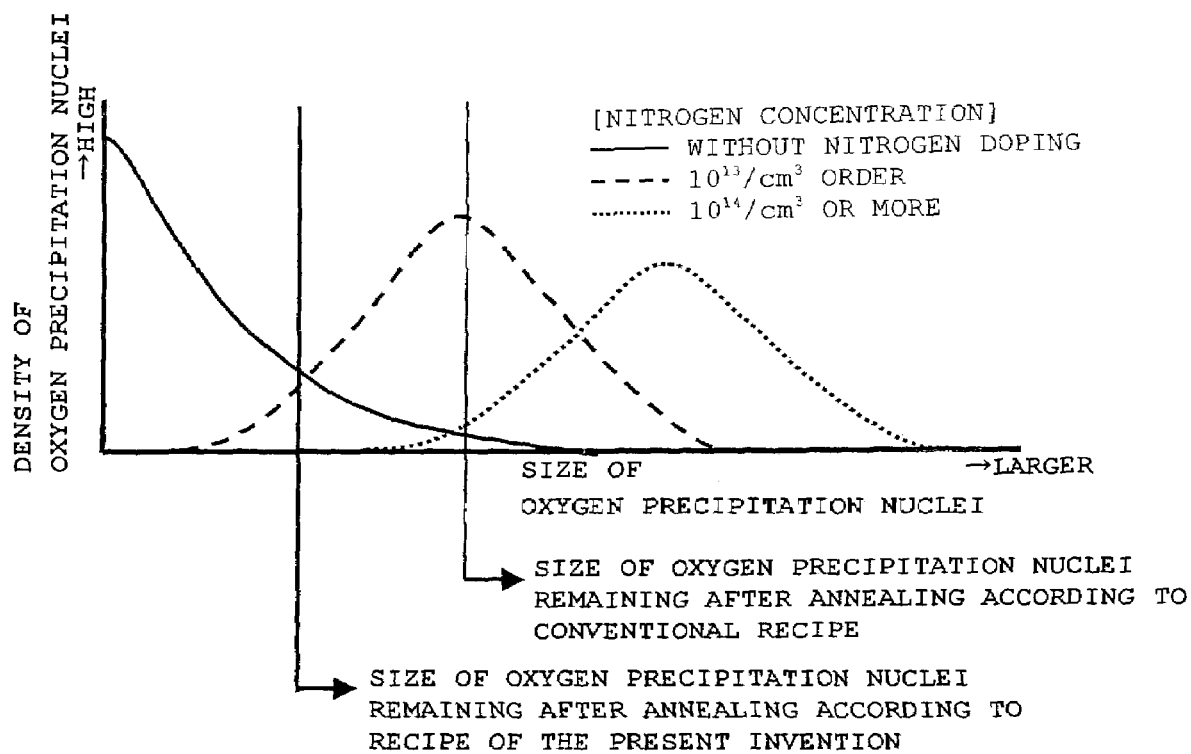
FIG. 4 is a figure showing effects of nitrogen concentration on density and size of oxygen precipitation nuclei.

This can be explained based on consideration about the size of the oxygen precipitation nuclei grown by the annealing as shown in FIG. 4. That is, by reducing the rate of increasing temperature in the low temperature region of from 700° C. to 900° C. as shown in the annealing recipe according to the present invention, the time of maintaining a wafer in this temperature region becomes longer. As a result, the oxygen precipitation nuclei having a small size can be grown. Therefore, even in the wafers having a low nitrogen concentration ($10^{13}/cm^3$ order or less), the grown precipitation nuclei are not melted by the high temperature heat treatment performed thereafter, and the density of the remaining oxygen precipitation nuclei is increased. In contrast, in the wafers having a high nitrogen concentration ($1 \times 10^{14}/cm^3$ or more), they contained oxygen precipitation nuclei having such a size that most of the nuclei should not be melted even if the heat treatment was performed according to the conventional annealing recipe, and therefore, it is considered that, even if the annealing recipe was changed to the annealing recipe of the present invention, the BMD density was not increased so much.

The step of maintaining the wafer at a temperature lower than the temperature of the high temperature heat treatment is not limited to such a method as mentioned above in which the rate of increasing temperature is reduced to 2° C./min, and any method may be used so long as it consists of a step enabling beforehand sufficient growth of oxygen precipitation nuclei having such a size that the nuclei should be annihilated by a high temperature heat treatment at 1100° C. to 1350° C. to such a size that the nuclei should not be annihilated. For example, it is possible to use a two-step heat treatment in which a step of keeping a wafer at a certain temperature of from 700° C. to 900° C. for a predetermined period of time not shorter than 60 minutes is performed as the step of maintaining the wafer at a temperature lower than the temperature of the high temperature heat treatment and then the temperature is increased again to perform the high temperature heat treatment. As for the temperature region, the region of from 700° C. to 900° C. is preferred for the growth of the precipitation nuclei, however the temperature region is not strictly limited to the region of from 700° C. to 900° C., and a temperature that enables the growth of the precipitation nuclei may be used.

Further, in the step of maintaining the wafer in the temperature region of from 700° C. to 900° C., a lower rate of increasing temperature and a longer time of maintaining a wafer can provide more growth of the oxygen precipitation nuclei. However, unduly lower rate of increasing temperature and unduly longer time of maintaining a wafer invites reduction of productivity and increase of cost due to increase of the annealing time. Therefore, the rate of increasing temperature of 1° C./min or more and the time of maintaining a wafer of 200 minutes or less are preferred, because such a rate and time provide sufficient growth of oxygen precipitation nuclei.

Hereafter, the present invention will be explained more specifically with reference to the following examples and comparative example. However, the present invention is not limited to these.

EXAMPLE 1

120 kg of raw material polycrystal silicon was charged into a quartz crucible having a diameter of 24 inches (600 mm), and a silicon single crystal having a diameter of 200 mm was pulled for about 120 cm. Nitrogen doping was attained by introducing a predetermined amount of silicon wafers having nitride films into the raw material. The nitrogen concentration in a portion near the shoulder of the single crystal ingot was $2.0 \times 10^{13}[/cm^3]$ as a calculated value, and the nitrogen concentration in the last side of the straight body was calculated to be $10.0 \times 10^{13}[/cm^3]$ at most. From this single crystal ingot, wafers were sliced and subjected to lapping, chamfering and polishing to produce mirror surface wafers. Then, the mirror surface wafers obtained by slicing of portions near the shoulder, at the center of the straight body and at the lower end of the straight body (near the tail) of the single crystal ingot were maintained in the temperature region of from 700° C. to 900° C. for 100 minutes with a rate of increasing temperature of 2° C./min, and then subjected to annealing at 1200° C. for 1 hour in an argon atmosphere. The nitrogen-doped annealed wafers obtained from various portions of the ingot were subjected to a normal oxygen precipitation heat treatment at 800° C. for 4 hours and at 1000° C. for 16 hours to grow oxide precipitates into a detectable size, and then BMD density was measured by using OPP produced by BioRad Laboratories.

EXAMPLE 2

A single crystal ingot was grown in the same manner as in Example 1, and wafers were sliced from the single crystal ingot at portions near the shoulder, at the center of the straight body and near the tail of the straight body, and polished to produce mirror surface wafers. Then, the obtained mirror surface wafers were maintained in the temperature region of from 700° C. to 900° C. for 67 minutes with a rate of increasing temperature of 3° C./min, and then subjected to annealing at 1200° C. for 1 hour in an argon atmosphere. Then, the obtained nitrogen-doped annealed wafers were subjected to the same oxygen precipitation heat treatment as in Example 1, and BMD density was measured.

COMPARATIVE EXAMPLE 1

A single crystal ingot was grown in the same manner as in Example 1, and wafers were sliced from the single crystal ingot at portions near the shoulder, at the center of the straight body and near the tail of the straight body, and polished to produce mirror surface wafers. Then, the obtained mirror surface wafers were heated in the temperature region of from 700° C. to 900° C. with a rate of increasing temperature of 5° C./min (maintaining time: 40 minutes), and then subjected to annealing at 1200° C. for 1 hour in an argon atmosphere. Then, the obtained nitrogen-doped annealed wafers were subjected to the same oxygen precipitation heat treatment as in Example 1, and BMD density was measured.

The results of the measurement of BMD density for the nitrogen-doped annealed wafers obtained from various portions of single crystal ingots in Examples 1 and 2 and Comparative Example 1 are shown in Table 1.

TABLE 1

| Rate of increasing temperature for 700-900° C. | Portion near shoulder of straight body | Center of straight body | Portion near tail of straight body |
|---|---|---|---|
| (Example 1) 2° C./min | $4.0 \times 10^9$ [/cm$^3$] | $4.0 \times 10^9$ [/cm$^3$] | $3.0 \times 10^9$ [/cm$^3$] |
| (Example 2) 3° C./min | $1.0 \times 10^9$ [/cm$^3$] | $2.0 \times 10^9$ [/cm$^3$] | $3.0 \times 10^9$ [/cm$^3$] |
| (Comparative Example 1) 5° C./min | $0.8 \times 10^9$ [/cm$^3$] | $1.0 \times 10^9$ [/cm$^3$] | $3.0 \times 10^9$ [/cm$^3$] |

From the measurement results shown in Table 1, it can be seen that, if the rate of increasing temperature was 3° C./min or less, variation of the BMD density depending on portions of crystal was sufficiently reduced. It can be further seen that a lower rate of increasing temperature sufficiently increased the BMD density at a portion near the shoulder.

The present invention is not limited to the embodiments described above. The above-described embodiments are mere examples, and those having the substantially same structure as that described in the appended claims and those providing similar functions and advantages are all included in the scope of the present invention.

For example, in the aforementioned examples, cases of utilizing argon as the atmosphere for the high temperature heat treatment are exemplified. However, the present invention can be similarly applied to a case where the high temperature heat treatment is performed in a hydrogen atmosphere or a mixed atmosphere of hydrogen and argon.

The invention claimed is:

1. A method for producing a nitrogen-doped annealed wafer, wherein before a wafer sliced from a silicon single crystal doped with at least nitrogen and polished is subjected to a high temperature heat treatment at 1100° C. to 1350° C. in an atmosphere of argon, hydrogen or a mixed gas thereof, a step of maintaining the wafer within a temperature region of from 700° C. to 900° C. for 60 minutes to 200 minutes is conducted to allow growth of oxygen precipitation nuclei to such a size that the nuclei should not be annihilated by the high temperature heat treatment, and then the high temperature heat treatment is performed, the step of maintaining the wafer within the temperature region of from 700° C. to 900° C. for 60 to 200 minutes being performed with a rate of increasing temperature of 3° C./min or less for the temperature region of from 700° C. to 900° C.

2. The method for producing a nitrogen-doped annealed wafer according to claim 1, wherein the step of maintaining the wafer within the temperature region of from 700° C. to 900° C. for 60 minutes to 200 minutes is conducted during a process of increasing temperature to the treatment temperature of the high temperature heat treatment.

3. A nitrogen-doped annealed wafer produced by the method according to claim 2.

4. A nitrogen-doped annealed wafer produced by the method according to claim 1.

* * * * *